United States Patent
Moon et al.

(10) Patent No.: US 8,289,774 B2
(45) Date of Patent: Oct. 16, 2012

(54) FLASH MEMORY DEVICE AND OPERATING METHOD OF FLASH MEMORY DEVICE

(75) Inventors: Seung-Hyun Moon, Seoul (KR); Ki-Hwan Choi, Gyeonggi-do (KR); Hyung-Gon Kim, Suwon-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 275 days.

(21) Appl. No.: 12/414,973

(22) Filed: Mar. 31, 2009

(65) Prior Publication Data

US 2009/0262576 A1 Oct. 22, 2009

(30) Foreign Application Priority Data

Apr. 18, 2008 (KR) .................................. 2008-36193

(51) Int. Cl.
*G11C 11/34* (2006.01)
(52) U.S. Cl. .................. 365/185.18; 365/185.2
(58) Field of Classification Search ............. 365/185.17, 365/185.18, 185.2, 185.29
See application file for complete search history.

(56) References Cited

U.S. PATENT DOCUMENTS

| 7,272,049 | B2 | 9/2007 | Kang et al. |
| 2006/0139997 | A1 | 6/2006 | Park et al. |
| 2006/0239077 | A1 | 10/2006 | Park et al. |
| 2007/0047314 | A1* | 3/2007 | Goda et al. ............... 365/185.18 |
| 2007/0159886 | A1* | 7/2007 | Kang ....................... 365/185.17 |
| 2007/0236990 | A1* | 10/2007 | Aritome ................... 365/185.01 |
| 2007/0279981 | A1* | 12/2007 | Abe et al. .................. 365/185.2 |
| 2008/0007999 | A1 | 1/2008 | Park et al. |
| 2008/0137409 | A1* | 6/2008 | Nakamura et al. ......... 365/185.2 |
| 2008/0273388 | A1* | 11/2008 | Chin et al. ............... 365/185.17 |

FOREIGN PATENT DOCUMENTS

| JP | 2006-059481 | 3/2006 |
| JP | 2007-184090 | 7/2007 |
| KR | 1020060074179 | 7/2006 |
| KR | 1020060110755 | 10/2006 |
| KR | 1020070029299 | 3/2007 |
| KR | 10-0784862 | 12/2007 |
| KR | 10-2008-0005765 | 1/2008 |

* cited by examiner

*Primary Examiner* — Douglas King
(74) *Attorney, Agent, or Firm* — Volentine & Whitt, PLLC

(57) ABSTRACT

Disclosed is an operating method of a flash memory device, which includes normal memory cells and dummy memory cells. The operating method includes programming the normal memory cells and programming the dummy memory cells. A dummy pass voltage used for programming the dummy memory cells is different from a normal pass voltage used for programming the normal memory cells.

17 Claims, 5 Drawing Sheets

|  | MCs program | Block erase | DMCs program |
|---|---|---|---|
| BL | Vss (program)<br>Vcc (program inhibit) | Float | Vss (program)<br>Vcc (program inhibit) |
| SSL | Vcc | Float | Vcc |
| DWLs | Vpassn | Vss | Vpgm2 (selected)<br>Vpassd (unselected) |
| WLs | Vpgm1 (selected)<br>Vpassn (unselected) | Vss | Vpassd |
| GSL | Vss | Float | Vss |
| CSL | Vss | Float | Vss |
| Bulk | Vss | Vera | Vss |

Fig. 5

```
Start
  ↓
Program normal cells — S210
  ↓
Program dummy cells — S220
  ↓
Block erase
except for dummy cells — S230
  ↓
End
```

Fig. 6

| | MCs program | DMCs program | Block erase |
|---|---|---|---|
| BL | Vss (program)<br>Vcc (program inhibit) | Vss (program)<br>Vcc (program inhibit) | Float |
| SSL | Vcc | Vcc | Float |
| DWLs | Vpass | Vpgm (selected)<br>Vpass (unselected) | Float |
| WLs | Vpgm (selected)<br>Vpass (unselected) | Vpass | Vss |
| GSL | Vss | Vss | Float |
| CSL | Vss | Vss | Float |
| Bulk | Vss | Vss | Vera |

US 8,289,774 B2

FLASH MEMORY DEVICE AND OPERATING METHOD OF FLASH MEMORY DEVICE

CLAIM OF PRIORITY

A claim of priority under 35 U.S.C. §119 is made to Korean Patent Application No. 10-2008-0036193, filed on Apr. 18, 2008, the entire contents of which are hereby incorporated by reference.

SUMMARY

The present invention relates to a semiconductor memory device. More particularly, the present invention relates to a flash memory device and its operating method.

Semiconductor memory devices are storage devices that store data and read the stored data as needed. Semiconductor memory devices may be classified as random access memory (RAM) or read only memory (ROM). RAM is volatile memory which loses stored data when power is removed. ROM is non-volatile memory which retains stored data even when power is removed. There are various types of RAM, including dynamic RAM (DRAM), static RAM (SRAM), and the like. Likewise, there are various types of ROM, including programmable ROM (PROM), electrically programmable ROM (EPROM), electrically erasable programmable ROM (EEPROM), flash memory, and the like. Flash memory may be classified as NOR-type flash memory or NAND-type flash memory. NAND-type flash memory is more highly integrated than NOR-type flash memory.

A flash memory device may include a memory cell array having cell strings to which multiple memory cell transistors are connected in series. String select transistors are provided between cell strings and bit lines, respectively. The string select transistors in the cell strings are connected to a string select line. Ground select transistors are provided between cell strings and a common source line, respectively. The ground select transistors in cell strings are connected to a ground select line. Memory cell transistors in the cell strings are connected to corresponding word lines.

Operating performance of a flash memory device may be improved by forming a memory cell array to have a dummy word line and dummy memory cells connected to the dummy word line. For instance, word lines adjacent to a string select line or a ground select line may be provided as dummy word lines.

An aspect of the present invention provides an operating method of a flash memory device, including normal memory cells and dummy memory cells. The operating method includes programming the normal memory cells, and programming the dummy memory cells. A dummy pass voltage used for programming the dummy memory cells is different from a normal pass voltage used for programming the normal memory cells.

Another aspect of the present invention provides a flash memory device which includes a memory cell array and a controller. The memory cell array includes normal memory cells and dummy memory cells. The controller is configured to control program operations and an erase operation with respect to the memory cell array, where a dummy pass voltage used in a program operation of the dummy memory cells is different from a normal pass voltage used in a program operation of the normal memory cells.

Another aspect of the present invention provides a memory system which includes a flash memory device and a memory controller configured to control the flash memory device. The flash memory device includes a memory cell array and a controller. The memory cell array includes normal memory cells and dummy memory cells. The controller is configured to control program operations and an erase operation with respect to the memory cell array, where the controller controls a program operation of the normal memory cells and a program operation of the dummy memory cells such that a dummy pass voltage used for the program operation of the dummy memory cells is different from a normal pass voltage used for the program operation of the normal memory cells.

BRIEF DESCRIPTION OF THE FIGURES

The attached drawings illustrate exemplary and non-limiting embodiments of the present invention, where like reference numerals refer to like parts throughout the figures unless otherwise specified.

FIG. 5 is a flow chart showing a method of programming dummy memory cells, according to a second embodiment of the present invention.

FIG. 6 is a table showing voltage conditions corresponding to the program method illustrated in FIG. 5.

DETAILED DESCRIPTION OF THE EMBODIMENTS

Figure 1:
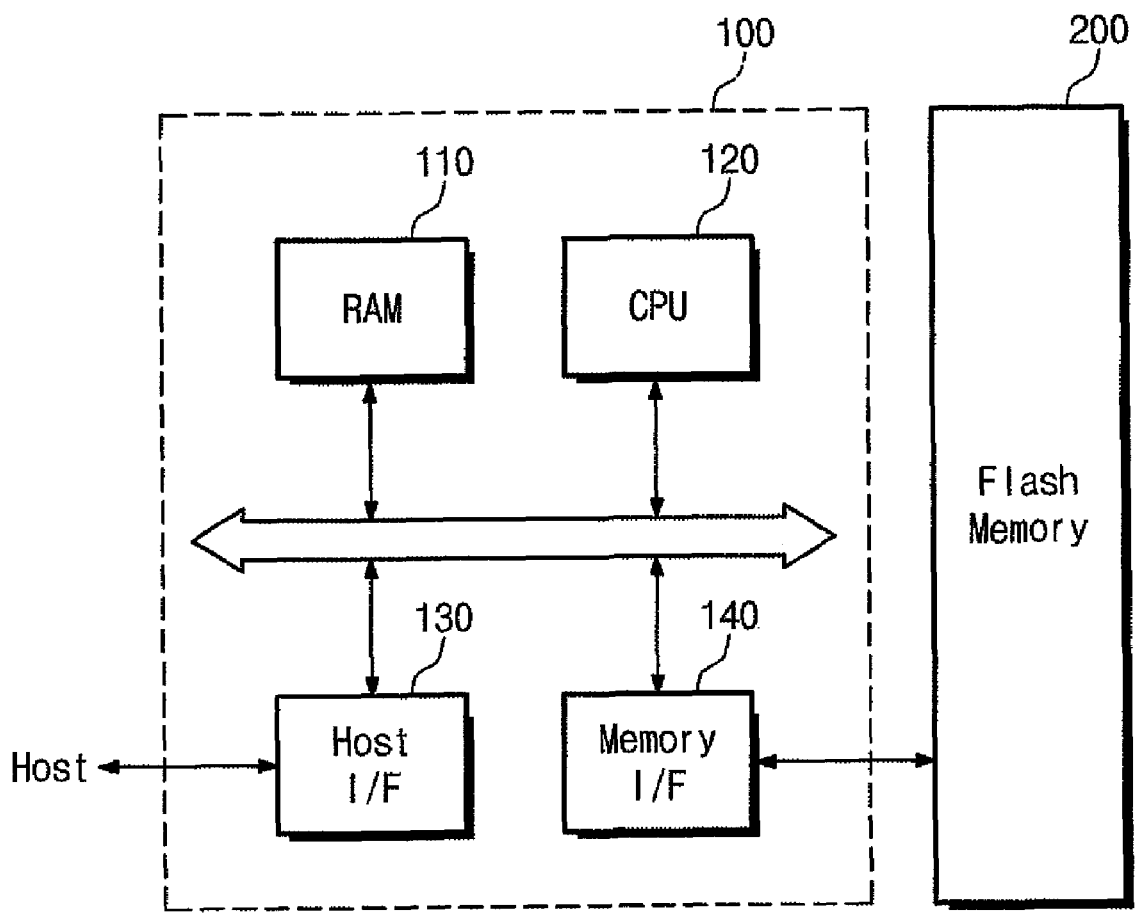
FIG. 1 is a block diagram showing a memory system, according to an embodiment of the present invention.

Preferred embodiments of the present invention will be described below in more detail with reference to the accompanying drawings, showing a flash memory device as an example for illustrating structural and operational features by the invention. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Like reference numerals refer to like elements throughout the accompanying figures.

A flash memory device according to embodiments of the present invention perform program operations with respect to normal and dummy memory cells. In particular, a pass voltage used during a program operation of normal memory cells (hereinafter, referred to as "normal pass voltage") may be different from a pass voltage used during a program operation of dummy memory cells (hereinafter, referred to as "dummy pass voltage"). This bias condition prevents program disturbance when programming the dummy memory. Thus, threshold voltages of the dummy memory cells are distributed within a given voltage range.

FIG. 1 is a block diagram showing a memory system, according to an illustrative embodiment of the present invention. Referring to FIG. 1, a memory system 10 includes a memory controller 100 and a flash memory device 200.

The memory controller 100 is connected to a host and the flash memory device 200. The memory controller 100 sends data read out from the flash memory device 200 to the host, and stores data received from the host in the flash memory device 200. The flash memory device 200 will be more fully described with reference to FIG. 2, below.

In the depicted embodiment, the memory controller 100 includes RAM 110, a processing unit 120, a host interface 130, and a memory interface 140. RAM 110 may be used as an operating memory of the processing unit 120, which controls operations of the memory controller 100. The host interface 130 interfaces with the host, for example, using a protocol for performing data exchange between the host and the memory controller 100. The memory interface 140 interfaces with the flash memory device 200.

The memory controller 100 may further include an error correcting block (not shown), which detects and corrects errors of data read from the flash memory device 200. Constituent elements of the memory controller 10 are well known, and thus detailed descriptions thereof are not included.

Figure 2:
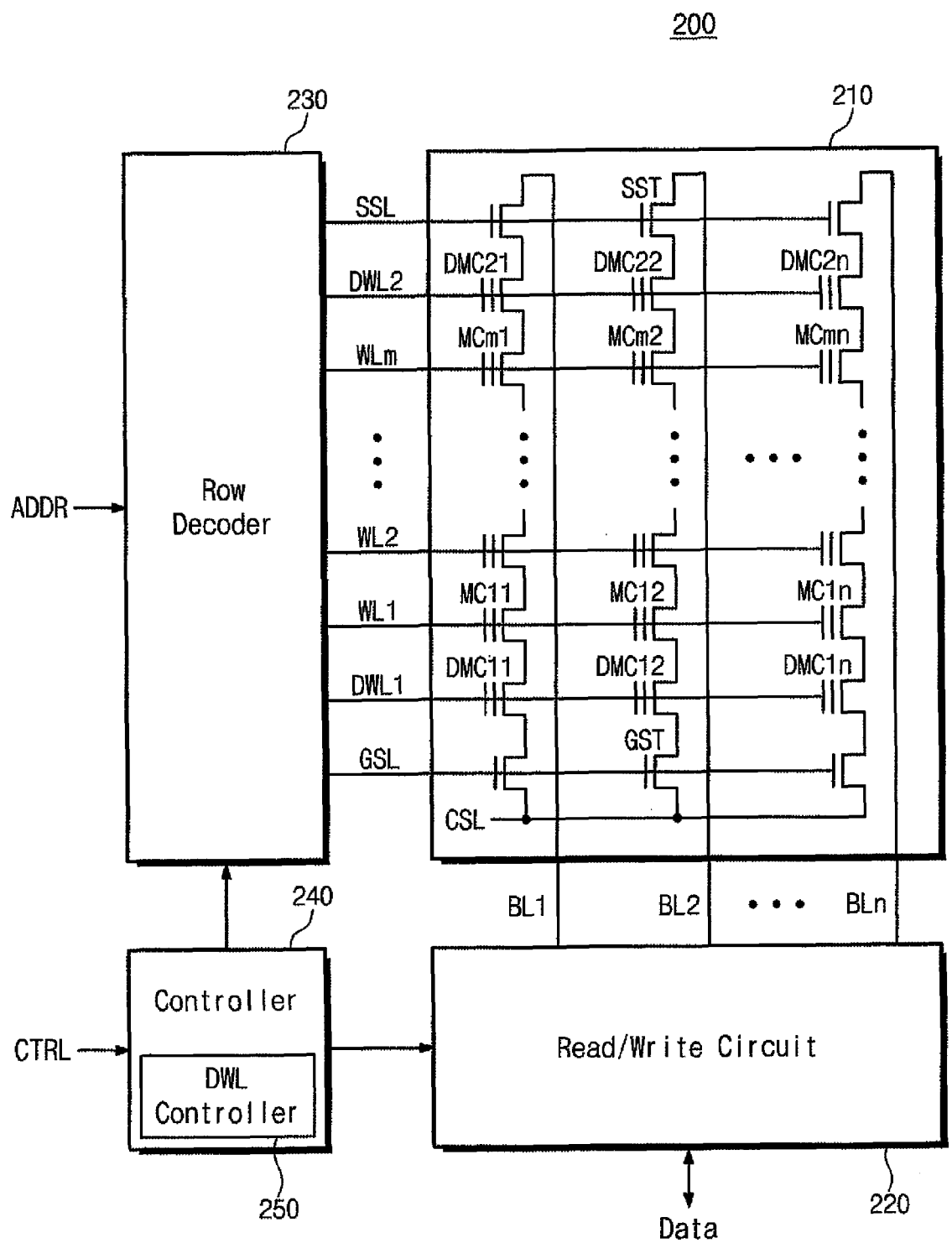
FIG. 2 is a block diagram showing a flash memory device in FIG. 1, according to an embodiment of the present invention.

FIG. 2 is a block diagram showing a flash memory device in FIG. 1, according to an illustrative embodiment. Referring to FIG. 2, the flash memory device 200 includes a memory cell array 210, a read/write circuit 220, a row decoder 230, and a controller 240.

The memory cell array 210 is connected to the read/write circuit 220 via bit lines BL1 to BLn and to the row decoder 230 via word lines WL1 to WLm, dummy word lines DWL1 and DWL2, string select line SSL and ground select line GSL. The memory cell array 210 may be formed of multiple memory blocks, although FIG. 2 illustrates one representative memory block, for purposes of description. Each of the memory blocks in the memory cell array 210 includes multiple memory cells MC (e.g., representative memory cells MC11 to MCmn, DMC11 to DMC1$n$ and DMC21 to DMC2$n$).

String select transistors SST are located between strings of memory cells MC and bit lines BL1 to BLn, respectively. Ground select transistors GST are located between the strings of memory cells MC and common source line CSL, respectively. The memory cells MC are respectively gated to the word lines WL1 to WLm, DWL1 or DWL2, the string select transistors SST are gated to the string select line SSL, and the ground select transistors GST are gated to the ground select line GSL.

Word lines adjacent to the string select line SSL and the ground select line GSL are dummy word lines DWL (e.g., dummy word lines DWL1 and DWL2), and memory cells connected to the dummy word lines are dummy memory cells DMC (e.g., dummy memory cells DMC11 to DMC1$n$ and DMC21 to DMC2$n$). The flash memory device 200 programs the dummy memory cells DMC before or after an erase operation. This enables threshold voltages of the dummy memory cells DMC to be distributed within a given voltage range. Program operations of the dummy memory cells DMC will be more fully described with reference to FIGS. 3 to 6, below.

The read/write circuit 220 is connected to the memory cell array 210 and the controller 240. The read/write circuit 220 operates in response to control of the controller 240, and may exchange data with external devices. The read/write circuit 220 writes data in the memory cells MC via the bit lines BL1 to BLn and/or reads data from the memory cells MC via the bit lines BL1 to BLn.

The row decoder 230 is connected to the memory cell array 210 and the controller 240. The row decoder 230 operates in response to control of the controller 240. The row decoder 230 receives externally provided address ADDR and selects the word lines WL1 to WLm, DWL1 and DWL2 of the memory cell array 210 in response to the received address ADDR.

The controller 240 controls operations of the flash memory device 200 using control logic, which may be implemented using software, hard-wired logic circuits, or a combination therefore. The controller 240 operates in response to externally provided control signals CTRL. In exemplary embodiments, the control signals CTRL may be received from the memory controller 100 (refer to FIG. 1). The controller 240 includes a dummy word line controller 250 configured to control program operations of the dummy memory cells DMC.

The controller 240 may further include a high voltage generator circuit (not shown), which generates high voltages needed to perform program, read and erase operations of the flash memory device 200.

When dummy memory cells are not included in a memory cell array, during a program operation, a channel voltage of each program-inhibited normal memory cell MC is a high voltage, boosted from power supply voltage Vcc by program voltage Vpgm. Meanwhile, ground voltage Vss is applied to gate and source regions of ground select transistors GST. In this case, gate induced drain leakage (GIDL) current may be generated since a large voltage difference arises between the channel voltage of each normal memory cell MC and the voltage applied to the gate and source regions of the ground select transistor GST in the same string.

A drain region of the ground select transistor GST is connected to channels of the normal memory cells MC. That is, a voltage applied to the drain region of the ground select transistor GST is a high voltage, while a voltage applied to the gate region of the ground select transistor GST is ground voltage Vss. Band-to-band-tunneling (BTBT) arises due to an electric field that is forced between the drain and gate regions of the ground select transistor GST. The BTBT forces electron-hole pairs to be generated. Electrons flow into the drain region of the ground select transistor GST, and holes are drained out through a bulk region. That is, leakage current flows from the drain region of the ground select transistor GST to the bulk region.

When leakage current is generated, channel voltages of the normal memory cells MC are lowered, causing program-inhibited normal memory cells MC to be programmed, resulting in program disturbance.

Further, electrons of the source region and/or the bulk region of the ground select transistor GST are accelerated to the drain region of the ground select transistor GST due to the electric field generated from the drain region of the ground select transistor GST. The accelerated electrons collide with silicon crystals to induce impact ionization, which causes electron-hole pairs to be generated. Electrons of the electron-hole pairs are again accelerated to the drain region of the ground select transistor GST. Hot electrons may be generated as a result.

A portion of the hot electrons flows into channels of normal memory cells MC via the drain region of the ground select transistor GST. The hot electrons flowing into the channels are injected into floating gates of the normal memory cells MC due to voltage applied to control gates of the normal memory cells MC. That is, program disturbance arises in which program-inhibited normal memory cells are programmed.

The channel voltages of the program-inhibited normal memory cells MC may be higher than the power supply voltage Vcc. Thus, normal memory cells MC adjacent to the string and ground select transistors SST and GST may suffer the program disturbance due to GIDL and hot electron injection.

In order to prevent the above-described program disturbances, word lines and memory cells adjacent to the string select transistor SST and/or the ground select transistor GST may be used as dummy word lines DWL1 and DWL2 and dummy memory cells DMC1 to DCM1n and DCM21 to DCM2n, according to embodiments of the present invention.

The channel voltages of the program-inhibited normal memory cells MC may be boosted during a program operation. For example, when each of the dummy memory cells DMC has a threshold voltage of −3V, source voltages of dummy memory cells DMC11 to DMC1n adjacent to the ground select transistors GST may be boosted to about 3V, and are turned off. At this time, a drain voltage of each ground select transistor GST is 3V, and its gate voltage is ground voltage Vss. No GIDL current is generated since only a small voltage difference occurs between drain and gate voltages of the ground select transistors GST.

When normal memory cells MC are erased, dummy memory cells DMC are also erased. However, when the erase operation is repeated with respect to the normal memory cells MC, the dummy memory cells DMC may be over erased. When the dummy memory cells DMC are over erased, there is an increase in voltage transferred to the drain region of each ground select transistor GST from the channels of the normal memory cells MC via the dummy memory cells DMC. That is, when the dummy memory cells DMC are over erased, GIDL current is generated between the dummy memory cells DMC and the string and ground select transistors SST and GST, and hot electrons are generated due to impact ionization. Thus, program disturbance occurs, as described above.

Accordingly, the flash memory device 200 causes threshold voltages of the dummy memory cells DMC to be distributed within a given voltage range, in accordance with embodiments of the present invention, in order to prevent the program disturbance from being generated at the normal memory cells MC adjacent to the dummy memory cells DMC. More particularly, the flash memory device 200 programs the dummy memory cells DMC after and/or before each erase operation.

However, when the dummy memory cells DMC are programmed, channel voltages of program inhibited dummy memory cells DMC are boosted, causing hot electrons, which are generated due to GIDL current and impact ionization. That is, program disturbance may arise when the dummy memory cells DMC are programmed. Accordingly, the flash memory device 200 programs the dummy memory cells DMC before and/or after each erase operation, while preventing program disturbance, as more fully described below with reference to FIGS. 3 to 6.

Figures 3, 4:
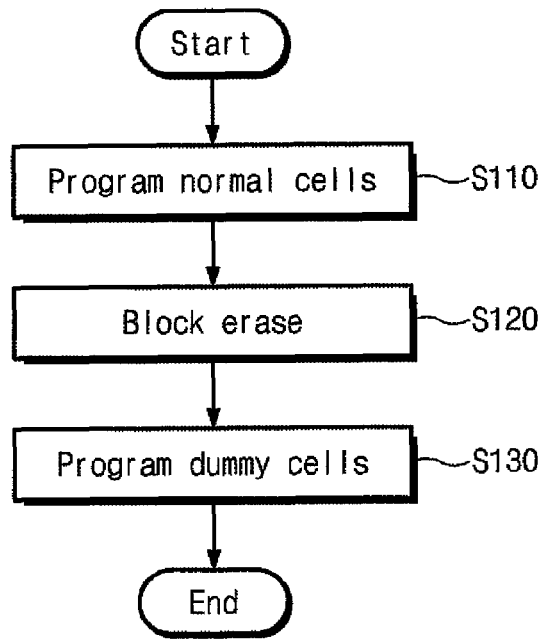
FIG. 3 is a flow chart showing a method of programming dummy memory cells, according to a first embodiment of the present invention.
FIG. 4 is a table showing voltage conditions corresponding to the program method illustrated in FIG. 3.

FIG. 3 is a flow chart showing a method of programming dummy memory cells according to a first embodiment of the present invention. FIG. 4 is a table showing voltage conditions corresponding to the program method illustrated in FIG. 3.

In accordance with the first embodiment of the present invention, dummy memory cells DMC are programmed after an erase operation, described with reference to FIG. 2 to 4. For example, when an erase command is received, dummy word line controller 250 controls the flash memory device 200 to program the dummy memory cells DMC after the erase operation of the normal memory cells MC.

In step S110 of FIG. 3, a program operation is performed to store data in at least one normal memory cell MC. For purposes of explanation, it is assumed that normal memory cell MC12 connected to word line WL1 is to be programmed and normal memory cells MC11 and MC1n are to be program inhibited.

As shown in FIG. 4, during the program operation, ground voltage Vss is applied to bit line BL2 connected to the normal memory cell MC12 to be programmed, and power supply voltage Vcc is applied to bit lines BL1 and BLn connected to the program inhibited normal memory cells MC11 and MC1n. The power supply voltage Vcc is also applied to the string select line SSL, and a normal pass voltage Vpassn is applied to the dummy word lines DWL1 and DWL2. A first program voltage Vpgm1 is applied to selected word line WL1, and ground voltage Vss is applied to the ground select line GSL, the common source line CSL and a bulk region.

Since ground voltage Vss is applied to the bit line BL2, a channel voltage of the normal memory cell MC12 is ground voltage Vss. Since the first program voltage Vpgm1 is applied to the normal (selected) word line WL1, the normal memory cell MC12 is programmed by Fowler-Nordheim (FN) tunneling.

Since the power supply voltage Vcc is applied to the bit lines BL1 and BLn, channel voltages of cell strings connected to the bit lines BL1 and BLn may be boosted up to the power supply voltage Vcc. More particularly, the channel voltages of the cell strings connected to the bit lines BL1 and BLn may be boosted to a voltage lower than the power supply voltage Vcc by a threshold voltage of the string select transistor SST. At this time, the string select transistors SST are turned off. When the first program voltage Vpgm1 is applied to the word line WL1, channel voltages of the cell strings connected to the bit lines BL1 and BLn are boosted. Thus, the normal memory cells MC11 and MC1n are not programmed.

In step S120 of FIG. 3, a block erase operation is executed in response to an externally provided erase command. During the erase operation, the bit lines BL1 to BLn and the string select line SSL are set to a floating state. Ground voltage Vss is applied to the dummy word lines DWL1 and DWL2 and the normal word lines WL1 to WLm. The ground select line GSL and the common source line CSL are floated, and an erase voltage Vera is applied to the bulk region. Since gates of the memory cells MC and DMC are supplied with ground voltage Vss and the erase voltage Vera is applied to the bulk region, memory cells MC and DMC are erased.

The dummy word line controller 250 responds to the erase command and controls the flash memory device 200 to program the dummy memory cells DMC after the erase operation in step S130 of FIG. 3. When the dummy memory cells DMC are programmed, ground voltage Vss is applied to bit line BL2 connected to the dummy memory cell DMC12 to be programmed. Power supply voltage Vcc is applied to bit lines BL1 and BLn connected to the dummy memory cells DMC11 and DMC1n to be program inhibited. Power supply voltage Vcc is also applied to the string select line SSL. Ground voltage Vss is applied to the ground select line GSL, the common source line CSL, and the bulk region. A dummy pass voltage Vpassd is applied to the unselected dummy word line DWL2 and the normal word lines WL1 to WLm. A second program voltage Vpgm2 is applied to the selected dummy word line DWL1.

Since ground voltage Vss is applied to the bit line BL2, the channel voltage of the dummy memory cell DMC12 may be ground voltage Vss. Since the second program voltage Vpgm2 is applied to the dummy word line DWL1 connected to the dummy memory cell DMC12, the dummy memory cell DMC12 is programmed.

In an illustrative embodiment, the second program voltage Vpgm2 used in the program operation of the dummy memory cells DMC is different from the first program voltage Vpgm1 used in the program operation of the normal memory cells MC. For example, when a target value for threshold voltages of the dummy memory cells DMC is lower than a target value for threshold voltages of the normal memory cells MC, the second program voltage Vpgm2 is set to a lower voltage level than the first program voltage Vpgm1. When a target value for threshold voltages of the dummy memory cells DMC is higher than a target value for threshold voltages of the normal memory cells MC, the second program voltage Vpgm2 is set to a higher voltage level than the first program voltage Vpgm1. During the program operations, the first and second program voltages Vpgm1 and Vpgm2 may be incremental step programming pulse (ISPP) voltages.

Since the power supply voltage Vcc is applied to the bit lines BL1 and BLn during the program operations, the channel voltages of the cell strings connected to the bit lines BL1 and BLn may be boosted up to the power supply voltage Vcc. More particularly, the channel voltages of the cell strings connected to the bit lines BL1 and BLn may be boosted to a voltage lower than the power supply voltage Vcc by a threshold voltage of the string select transistor SST. When the second program voltage Vpgm2 is applied to the dummy word line DWL1, the channel voltages of the cell strings connected to the bit lines BL1 and BLn may be boosted.

The dummy pass voltage Vpassd used during the program operation of the dummy memory cells DMC is different from the normal pass voltage Vpassn used during the program operation of the normal memory cells MC. For example, the dummy pass voltage Vpassd may be lower in level than the normal pass voltage Vpassn.

When the channel voltages of the cell strings connected to the bit lines BL1 and BLn are boosted, they are affected by the pass voltage Vpassd or Vpassn. Since the dummy pass voltage Vpassd is lower than the normal pass voltage Vpassn, the channel voltages of the cell strings during the program operation of the dummy memory cells DMC are lower than the channel voltages of the cell strings during the program operation of the normal memory cells MC. Thus, it is possible to prevent GIDL current and hot electrons from being generated between the string and ground select transistors SST and GST and the respectively adjacent dummy memory cells DMC. When the dummy memory cells DMC are programmed after the erase operation, the threshold voltages of the dummy memory cells DMC may be higher than the power supply voltage Vcc.

Accordingly, the flash memory device 200 prevents or reduces program disturbance of dummy memory cells DMC by setting the dummy pass voltage Vpassd to a voltage lower than the normal pass voltage Vpassn. Further, it is possible to maintain the threshold voltages of the dummy memory cells DMC within a given voltage range by programming the dummy memory cells DMC. That is, the flash memory device 200 prevents the dummy memory cells DMC from being over erased.

When an erase command is received, the dummy word line controller 250 according to the present embodiment controls the flash memory device 200 to program dummy memory cells DMC after the erase operation. Further, the dummy word line controller 250 may control the flash memory device 200 so that the dummy pass voltage Vpassd is set to be different from the normal pass voltage Vpassn, as discussed above.

In an exemplary embodiment, the dummy word line controller 250 adjusts a reference voltage provided to a voltage generator circuit in the controller 240 to set the normal and dummy pass voltages Vpassn and Vpassd differently from each other. In another exemplary embodiment, the dummy word line controller 250 may control the controller 240 or the row decoder 230, so that the normal pass voltage Vpassn is applied to word lines WL and DWL via one or more diodes. A voltage resulting from the one or more diodes may be used as the dummy pass voltage Vpassd.

Although in the embodiment described above, the dummy memory cells DMC are programmed after the erase operation, it is understood that the dummy memory cells DMC may be programmed before the erase operation, as discussed below. When the dummy memory cells DMC are programmed before the erase operation, threshold voltages of the dummy memory cells DMC are distributed within a given voltage range and are lower than ground voltage Vss.

Thus, when the normal memory cells MC are programmed, the pass voltage Vpassd applied to the dummy memory cells DMC may be lower than the pass voltage Vpassn applied to normal memory cells MC. For example, the pass voltage Vpassd applied to the dummy memory cells DMC may be ground voltage Vss.

FIG. 5 is a flow chart showing a method of programming dummy memory cells, according to a second embodiment of the present invention. FIG. 6 is a table showing voltage conditions corresponding to the program method illustrated in FIG. 5.

In accordance with the second embodiment of the present invention, dummy memory cells DMC are programmed before a block erase operation, as described with reference to FIGS. 2, 5 and 6. For example, when an erase command is received, dummy word line controller 250 controls the flash memory device 200 to program the dummy memory cells DMC before the erase operation of the normal memory cells MC.

In step S210 of FIG. 5, a program operation is performed to store data in at least one normal memory cell MC. For purposes of explanation, it is assumed that normal memory cell MC12 connected to word line WL1 is to be programmed and normal memory cells MC11 and MC1n are to be program inhibited.

As shown in FIG. 6, when the normal memory cells MC are programmed, ground voltage Vss is applied to bit line BL2 connected to the normal memory cell MC12 to be programmed. Power supply voltage Vcc is applied to bit lines BL1 and BLn connected to normal memory cells MC to be program inhibited. The power supply voltage Vcc is supplied to the string select line SSL, and pass voltage Vpass is applied to the dummy word lines DWL1 and DWL2 and the unselected word lines WL2 to WLm. Program voltage Vpgm is applied to the selected word line WL1, and ground voltage Vss is supplied to the ground select line GSL, the common source line CSL, and the bulk region. A program operation is repeated until all normal memory cells MC are programmed normally.

After the normal memory cells MC have been programmed, the procedure goes to step S220, in which the dummy memory cells DMC are programmed.

During the program operation of the dummy memory cells DMC, ground voltage Vss is supplied to the bit line BL2 connected to the dummy memory cell DMC12 to be programmed. The power supply voltage Vcc is applied to the bit lines BL1 and BLn connected to the dummy memory cells DMC11 and DMC1n to be program inhibited. The power supply voltage Vcc is also applied to the string select line SSL, and the program voltage Vpgm is applied to the selected dummy word line DWL1. The pass voltage Vpass is applied to the unselected dummy word line DWL2 and the normal word lines WL1 to WLm. Ground voltage Vss is applied to the ground select line GSL, the common source line CSL, and the bulk region.

Since ground voltage Vss is applied to the bit line BL2 connected to the dummy memory cell DMC12 to be programmed, the channel voltage of the dummy memory cell DMC12 is ground voltage Vss. When the program voltage Vpgm is applied to dummy word line DWL1 connected to the dummy memory cell DMC12, the dummy memory cell DMC12 is programmed. In various embodiments, the program voltage used to program the normal memory cells MC may be different from the program voltage used to program dummy memory cells DMC. At this time, threshold voltages of programmed normal memory cells MC may be different from threshold voltages of programmed dummy memory cells DMC.

When the power supply voltage Vcc is applied to the bit lines BL1 and BLn connected to the dummy memory cells DMC11 and DMC1n to be program inhibited, the channel voltages of cell strings connected to the bit lines BL1 and BLn may be increased up to the power supply voltage. More particularly, the channel voltages of the cell strings connected to the bit lines BL1 and BLn may be boosted to voltage lower than the power supply voltage Vcc by a threshold voltage of string select transistor SST. When the program voltage Vpgm is applied to the dummy word line DWL1, the channel voltages of the cell strings connected to the bit lines BL1 and BLn may be boosted.

Following step S210, the normal memory cells MC are in a programmed state, respectively. In other words, the normal memory cells MC may have higher threshold voltages. A voltage difference between a channel and a gate of each of the normal memory cells MC being programmed is more than a voltage difference between a channel and a gate of each of the normal memory cells MC not being programmed. That is, the channel voltages of the normal memory cells MC being programmed are lower than the channel voltages of the normal memory cells MC not being programmed.

When the dummy memory cells DMC are programed in step S220 after the normal memory cells MC are programmed, the voltage differences between the channels of the string and ground select transistors SST and GST and the channels of the dummy memory cells DMC are reduced, respectively. Thus, it is possible to prevent GIDL current and hot electrons from be generated between the string and ground select transistors SST and GST and the dummy memory cells DMC, respectively. That is, it is possible to prevent or reduce program disturbance of the dummy memory cells DMC.

In step S230, a block erase operation is performed. During the erase operation, the bit lines BL1 to BLn and the string select line SSL are floated. The dummy word lines DWL1 and DWL2 are floated, and ground voltage Vss is applied to the normal word lines WL1 to WLm. The ground select line GSL and the common source line CSL are floated, and an erase voltage Vera is applied to the bulk region. Since ground voltage Vss is applied to the control gates of the normal memory cells MC and the erase voltage Vera is applied to the bulk region, the normal memory cells MC are erased.

In comparison, since the control gates of the dummy memory cells DMC are floated, the dummy memory cells DMC are not erased even though the erase voltage Vera is applied to the bulk region. This is because a voltage of the control gates of the dummy memory cells DMC is boosted due to coupling between the control gates of the dummy memory cells DMC and the bulk region. Thus, although the erase operation is executed, threshold voltages of the dummy memory cells DMC are maintained within a given voltage range.

Accordingly, the flash memory device 200 is able to prevent or reduce program disturbance of the dummy memory cells DMC by programming normal memory cells MC before programming the dummy memory cells DMC. Further, the flash memory device 200 maintains threshold voltages of the dummy memory cells DMC within a given voltage range by programming the dummy memory cells DMC before the erase operation. That is, the flash memory device 200 prevents the dummy memory cells DMC from being over erased.

When an erase command is received, the dummy word line controller 250 according to the present embodiment controls the flash memory device 200 to program the dummy memory cells DMC before the erase operation.

In exemplary embodiments, when the erase command is received, the dummy word line controller 250 controls the flash memory device 200 so that the normal memory cells MC are programmed, the dummy memory cells DMC are programmed, and the erase operation is executed. As a result of the program operation of the normal memory cells MC, the normal memory cells MC are in a programmed state. As a result of the program operation of the dummy memory cells DMC, the dummy memory cells DMC are in a programmed state. As a result of the erase operation, the normal memory cells are erased, while the dummy memory cells DMC are not erased.

In comparison, in embodiments in which the dummy memory cells DMC are erased during an erase operation, a program operation may be further performed with respect to the dummy memory cells DMC after the erase operation. For example, when a program operation is to be performed with respect to the dummy memory cells DMC after the erase operation, a program method described above with reference to FIGS. 2, 3 and 4 may be used.

Further, in various exemplary embodiments, the program method described with reference to FIGS. 2, 3 and 4 may be used together with the program method described with reference to FIGS. 2, 5 and 6. That is, in exemplary embodiments, dummy memory cells DMC may be programmed after all normal memory cells MC are programmed to be in a programmed state. At this time, a normal pass voltage Vpassn used for the program operation of the normal memory cells MC may be different from a dummy pass voltage Vpassd used for the program operation of the dummy memory cells DMC. For example, the dummy pass voltage Vpassd may be lower in level than the normal pass voltage Vpassn.

Afterwards, an erase operation may be executed. When only normal memory cells MC are erased, the threshold voltages of the dummy memory cells DMC may be maintained within a given voltage range. For example, the threshold voltages of the dummy memory cells DMC may be higher than power supply voltage Vcc. When the normal and dummy memory cells MC and DMC are all erased, the threshold voltages of the dummy memory cells DMC may still be maintained within a given voltage range. For example, the threshold voltages of the dummy memory cells DMC may be lower than ground voltage Vss.

If the threshold voltages of the dummy memory cells DMC are lower an the ground voltage Vss, a further program operation may be executed with respect to the dummy memory cells DMC. At this time, a normal pass voltage Vpassn used for the program operation of the normal memory cells MC may be different from a dummy pass voltage Vpassd used for the program operation of the dummy memory cells DMC. For example, the dummy pass voltage Vpassd may be lower in level than the normal pass voltage Vpassn. At this time, the threshold voltages of the dummy memory cells DMC may be maintained within a given voltage range. For example, the threshold voltages of the dummy memory cells DMC may be higher than the ground voltage Vss.

When the flash memory device 200 programs dummy memory cells DMC after an erase operation, a normal pass voltage Vpassn used for the program operation of the normal memory cells MC may be different from a dummy pass voltage Vpassd used for the program operation of the dummy memory cells DMC. Further, the flash memory device 200 may program the normal memory cells MC before the erase operation, so that the normal memory cells MC are in a programmed state. In various embodiments, after the program operation of the normal memory cells MC is complete, the flash memory device 200 may program the dummy memory cells DMC, as discussed above. An erase operation is executed after all the dummy memory cells DMC are programmed. During the erase operation, the dummy memory cells DMC are not erased, while the normal memory cells MC are erased.

Accordingly, it is possible to prevent or reduce GIDL and scattering phenomenon between the string and ground select transistors SST and GST and dummy memory cells DMC, respectively. That is, it is possible to prevent program disturbance of the dummy memory cells DMC. Thus, the dummy memory cells DMC are programmed without program disturbance, and threshold voltages of the dummy memory cells DMC are maintained within a given voltage range.

Figure 7:
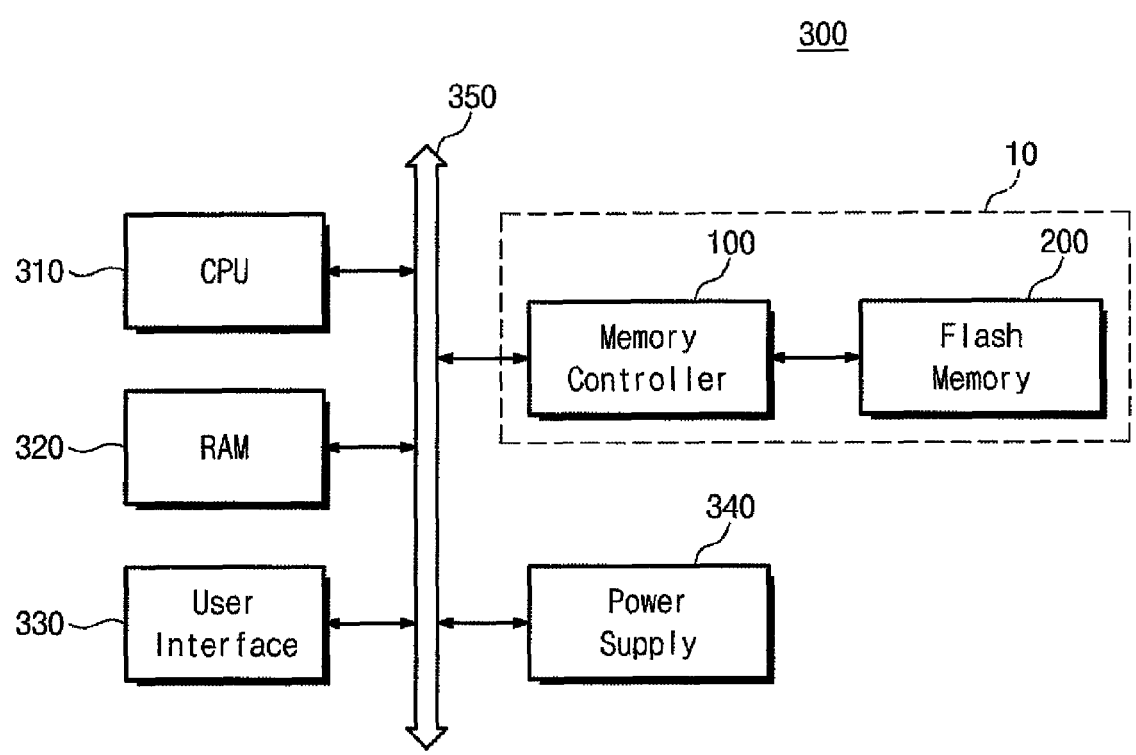
FIG. 7 is a block diagram showing a computing system including a flash memory device, according to an embodiment of the present invention.

FIG. 7 is a block diagram showing a computing system, including a flash memory device, according to an embodiment of the present invention. Referring to FIG. 7, a computing system 300 includes central processing unit (CPU) 310, RAM 320, a user interface 330, a power supply 340 and a memory system 10.

The memory system 10 includes a memory controller 100 and a flash memory device 200, according to the various embodiments of the present invention. The memory system 10 is electrically connected to the CPU 310, the RAM 320 and the user interface 330 via a system bus 350. Data provided via the user interface 330 or processed by the CPU 310 may be stored in the flash memory device 200 via the memory controller 100.

As described above, the flash memory device 200 may program dummy memory cells DMC before or after an erase operation. Thus, it is possible to prevent program disturbance of the dummy memory cells DMC, and threshold voltages of the dummy memory cells DMC are maintained within a given voltage range. The operating performance of the flash memory device 200 is therefore improved.

When the memory system 10 is a solid state disk (SSD) device, for example, a boosting speed of the computing system 300 may be significantly increased. Although not illustrated in the figures, the computing system according to various embodiments of the present invention may further include an application chipset, a camera image processor, and the like.

In the above-described embodiments, a dummy word line controller 250 configured to control a program operation of dummy memory cells DMC is included in controller 240. However, it is understood that alternative embodiments are not limited to the dummy word line controller 250 being included in the controller 240.

In the above-described embodiments, dummy memory cells DMC are programmed before and/or after an erase operation. However, it is understood that a post-program operation may be further executed after the erase operation in order to narrow a threshold voltage distribution of the normal memory cells MC.

In the above-described embodiments, the program disturbance and the program methods are described with reference to ground select transistors GST and dummy memory cells DMC (DMC11 to DMC1n) adjacent to the ground select transistors GST. However, it is understood that the description of the program disturbance and the program methods may also be applied to string select transistors SST and dummy memory cells DMC (DMC21 to DMC2n) adjacent to the string select transistors SST.

In the above-described embodiments, dummy memory cells DMC are programmed before and/or after an erase operation. However, it is understood that the program operation of the dummy memory cells DMC is not limited to this disclosure. It is further understood that control signals for executing the program operation of the dummy memory cells DMC may be separately provided from the memory controller 100 (refer to FIG. 1).

Also, although not specifically discussed above with respect to the various embodiments, it is understood that an erase verify operation may be executed following an erase operation of the flash memory device 200, and that a program verify operation may be executed following a program operation of the flash memory device 200.

Program data may be transferred from an external device when dummy memory cells DMC are programmed according to the various embodiments. For example, the program data may be transferred from the memory controller 100 (refer to FIG. 1). In other exemplary embodiments, the program data may be set by the read/write circuit 220 under control of the dummy word line controller 250.

The flash memory device 200 programs normal and dummy memory cells MC and DMC. In this case, a normal pass voltage Vpassn used for the program operation of the normal memory cells MC may be different from a dummy pass voltage Vpassd used for the program operation of the dummy memory cells DMC. Thus, it is possible to prevent program disturbance during a program operation for the dummy memory cells DMC, and threshold voltages of the dummy memory cells DMC are distributed within a given voltage range.

While the present invention has been shown and described in connection with exemplary embodiments thereof, it will be apparent to those skilled in the art that various modifications can be made without departing from the spirit and scope of the invention as defined by the appended claims.

What is claimed is:

1. An operating method of a flash memory device comprising normal memory cells and dummy memory cells, the normal memory cells are connected in series, and the dummy memory cells are connected to each end of the series connected normal memory cells forming a string of memory cells, the operating method comprising: programming the normal memory cells of the string by applying a first program voltage to a selected normal word line to program a selected normal memory cell; and programming the dummy memory cells by applying a second program voltage to a selected dummy word line to program a selected dummy memory cell, the second program voltage being different from the first program voltage, wherein a dummy pass voltage is applied to all unselected normal and dummy word lines of the string during the programming of the dummy memory cells, and a normal pass voltage is applied to all unselected normal and dummy word lines of the string during the programming of the normal memory cells, the dummy pass voltage being lower than the normal pass voltage.

2. The operating method of claim 1, wherein the dummy memory cells are programmed to have threshold voltages higher than a ground voltage.

3. The operating method of claim 2, wherein the dummy memory cells have a programmed state after programming the dummy memory cells.

4. The operating method of claim 1, further comprising:
performing an erase operation of the normal memory cells and the dummy memory cells.

5. The operating method of claim 4, wherein the erase operation is performed after programming the normal memory cells and before programming the dummy memory cells.

6. The operating method of claim 4, wherein the erase operation is performed after programming the dummy memory cells.

7. The operating method of claim 6, wherein programming the dummy memory cells is performed after programming the normal memory cells.

8. The operating method of claim 7, wherein the normal memory cells have a programmed state after programming of the normal memory cells.

9. The operating method of claim 6, wherein the dummy memory cells have a programmed state after programming the dummy memory cells.

10. The operating method of claim 6, wherein during the erase operation, the dummy memory cells are not erased, and the normal memory cells are erased.

11. A flash memory device comprising: a memory cell array comprising a plurality of normal memory cells and a plurality of dummy memory cells, the normal memory cells are connected in series, and the dummy memory cells are connected to each end of the series connected normal memory cells forming a string of memory cells; and a controller configured to control program operations and an erase operation with respect to the memory cell array, wherein a second program voltage and a dummy pass voltage used in a program operation of the dummy memory cells is different from a first program voltage and a normal pass voltage, respectively, used in a program operation of the normal memory cell, wherein the dummy pass voltage, which is applied to all unselected dummy and normal memory cells of the string during the program operation of the dummy memory cells is lower than the normal pass voltage, which is applied to all unselected dummy and normal memory cells of the string during the program operation of the normal memory cells.

12. The flash memory device of claim 11, wherein the controller controls the program operation of the dummy memory cell so that the dummy memory cells are programmed to have threshold voltages higher than a ground voltage.

13. The flash memory device of claim 11, wherein the controller controls the erase operation and the program operation of the dummy memory cells so that the dummy memory cells are programmed after the erase operation.

14. The flash memory device of claim 11, wherein the controller controls the program operation of the dummy memory cells so that the dummy memory cells are programmed before the erase operation.

15. The flash memory device of claim 14, wherein the controller controls the program operation of the normal memory cells so that the normal memory cells are all programmed before the program operation of the dummy memory cells.

16. The flash memory device of claim 14, wherein the controller controls the program operation of the dummy memory cells such that the dummy memory cells have threshold voltages higher than a power supply voltage.

17. The flash memory device of claim 14, wherein the controller controls the erase operation such that the normal memory cells are erased and the dummy memory cells are not erased.

* * * * *